United States Patent [19]
Tsukamoto

[11] Patent Number: 6,121,580
[45] Date of Patent: Sep. 19, 2000

[54] LAMP ANNEALER AND METHOD FOR ANNEALING SEMICONDUCTOR WAFER

[75] Inventor: Masayuki Tsukamoto, Tokyo, Japan

[73] Assignee: NEC Corporation, Tokyo, Japan

[21] Appl. No.: 09/281,113

[22] Filed: Mar. 29, 1999

[30] Foreign Application Priority Data

Apr. 2, 1998 [JP] Japan .................................. 10-090333

[51] Int. Cl.⁷ .................................................. F27B 5/14
[52] U.S. Cl. .......................... 219/390; 392/416; 118/724; 118/725
[58] Field of Search .................................... 219/390, 405, 219/411; 392/416, 418; 118/724, 725, 50.1, 728, 729, 730

[56] References Cited

FOREIGN PATENT DOCUMENTS

| | | | |
|---|---|---|---|
| 2-132824 | 5/1990 | Japan | H01L 21/26 |
| 5-198653 | 8/1993 | Japan | H01L 21/66 |
| 7-201765 | 8/1995 | Japan | H01L 21/22 |
| 8-37158 | 2/1996 | Japan | H01L 21/205 |

*Primary Examiner*—Teresa Walberg
*Assistant Examiner*—Shawntina F. Fuqua
*Attorney, Agent, or Firm*—Hayes, Soloway, Hennessey, Grossman & Hage, PC

[57] ABSTRACT

A lamp annealer for heating and annealing product wafers loaded into a chamber by a lamp means. The lamp annealer comprises a first chamber for loading product wafers, a second chamber disposed adjacent to the first chamber for loading only a dummy wafer, a pyrometer means for measuring a temperature of a wafer in the first chamber and a temperature of a wafer in the second chamber, and a lamp means for heating the wafer in the first chamber and the wafer in the second chamber. Periodically, dummy wafers are loaded into the first and second chambers, temperatures of the dummy wafer in the first chamber and the dummy wafer in the second chamber which are both heated by the lamp means are measured by the pyrometer means, and, when product wafers are annealed, intensity of light of the lamp is compensated based on a difference between the temperatures.

15 Claims, 5 Drawing Sheets

LAMP ANNEALER AND METHOD FOR ANNEALING SEMICONDUCTOR WAFER

FIELD OF THE INVENTION

The present invention relates generally to a lamp annealer or a lamp annealing apparatus used in a manufacturing process of a semiconductor device, and more particularly to controlling a temperature of a semiconductor wafer when the semiconductor wafer is heat treated by using the lamp annealer.

BACKGROUND OF THE INVENTION

With reference to the drawing, explanation will be made on a conventional lamp annealing apparatus or lamp annealer. The conventional lamp annealer comprises, as shown in a sectional view of FIG. 6, a chamber 1 made of quartz for annealing a wafer 4 held or loaded therein, a lamp 2 which is disposed over the chamber 1 and which generates infrared radiation, a pyrometer 3 which is disposed under the chamber 1 and which measures a temperature of the wafer 4 heated by the lamp 2, and a support member 5 on which the wafer 4 is held in the chamber 1.

The conventional lamp annealer is a single wafer processing apparatus which performs wafer processing one by one. In this apparatus, to perform anneal processing, the wafer 4 is at first held or loaded on the support member 5 in the chamber 1. Then, a voltage is applied to the lamp 2, and the lamp generates infrared radiation. The generated infrared transmits through the upper wall of the chamber 1 and is radiated on the wafer 4. The wafer radiated by the infrared is heated, and the light emitted from the heated wafer 4 transmits through the lower wall of the chamber 1. The light thus transmitted through the lower wall of the chamber 1 is measured by the pyrometer 3 to generate indication of a temperature. By using the indication of the temperature, the heating temperature of the wafer is adjusted to an appropriate value. Such heating process is performed on a wafer one by one.

In the conventional lamp annealer shown in FIG. 2 and described above, when the wafer to become a product is processed by heat treatment, emission of impurities, particles, molecules and the like, or outgassing, (hereinafter referred to as out-diffusion) occurs from inside of the wafer or from thin film formed on the wafer and so on. As these heat treatment is repeated a number of times, inside wall of the chamber is gradually contaminated due to the out-diffusion. Therefore, the light which is emitted from the heated wafer and which is to reach the pyrometer 3 is partially reflected or absorbed by the contaminated inner wall of the chamber 1 just above the pyrometer 3. As a result, quantity of light transmitting through the lower wall of the chamber 1 and arriving at the pyrometer 3 varies, and there was a deviation between an actual temperature of the wafer 4 and a temperature measured by the pyrometer 3. Therefore, it was impossible to appropriately control anneal temperature of the wafer.

In order to control the variation or dispersion of the anneal temperature of the wafer, Japanese patent laid-open publication No. 2-132824 proposes a lamp annealer. In the lamp annealer, a monitor wafer having the same characteristic in temperature rise and temperature fall as that of a silicon wafer to be processed is disposed near the silicon wafer to be processed, and temperature of the monitor wafer is monitored by a radiation thermometer to perform temperature control.

However, in the lamp annealer disclosed in Japanese patent laid-open publication No. 2-132824, since the monitor wafer and the wafer to be processed are both disposed in the same chamber, divergence between the actual temperature and the measured temperature of the wafer caused by the contamination of the inner wall of the chamber cannot be properly removed, and it is impossible to perform appropriate and reproducible heat treatment.

In order to solve the problems of the conventional technique mentioned above, present invention aims to improve reproducibility of the anneal temperature of a lamp annealer, and to stabilize characteristics of a product wafer.

SUMMARY OF THE INVENTION

This invention provides a lamp annealer for performing heat treatment of product wafers. The lamp annealer comprises a first chamber for loading with a product wafer to be heat treated or a dummy wafer, a second chamber disposed adjacent said first chamber, for loading with only a dummy wafer, a pyrometer means for measuring a temperature of a wafer within said first chamber and a temperature of a wafer within said second chamber, and a lamp means for heating a wafer within said first chamber and a wafer within said second chamber.

Periodically, a dummy wafer is loaded into said first chamber in place of said product wafer and at the same time a dummy wafer is loaded into said second chamber. Both dummy wafers are heated by said lamp means at the same time, and a temperature of said dummy wafer in said first chamber and a temperature of said dummy wafer in said second chamber are measured by said pyrometer means. Difference between the temperature of said dummy wafer within said first chamber and the temperature of said dummy wafer within said second chamber both measured by said pyrometer means is detected, and, when a product wafer within said first chamber is heat treated by said lamp means, the intensity of light generated by said lamp means is compensated based on said difference.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

Figure 1:
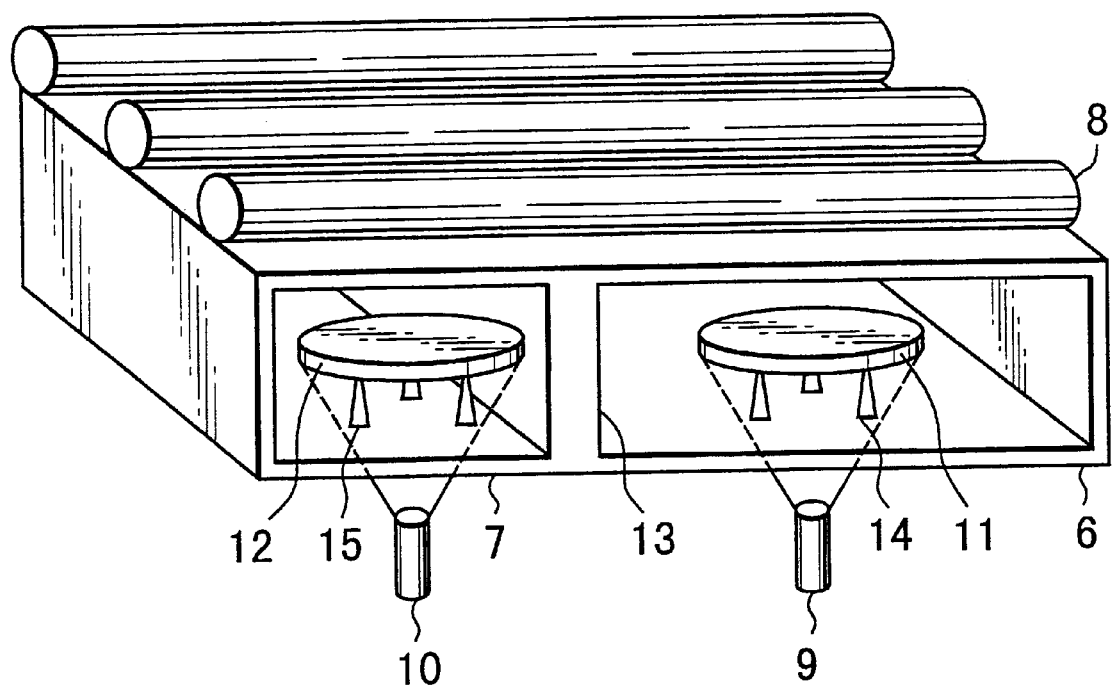
FIG. 1 is a perspective view illustrating a lamp annealer according to an embodiment of the present invention.

Embodiments of the present invention will now be described with reference to the drawings. FIG. 1 is a perspective view showing a lamp annealer according to an embodiment of the present invention. As shown in FIG. 1, the lamp annealer according to the present embodiment comprises one more attached chamber 7. The attached chamber 7 is disposed in addition to a chamber 6 which is used for heat treating a product wafer (a wafer on which thin film and the like is formed) under a lamp 8 as a heater. The chamber 6 and the attached chamber 7 are disposed adjacently via a partition 13.

Under the chamber 6 and the chamber 7 are disposed pyrometers 9 and 10, for example, radiation pyrometers, photoelectric pyrometers, optical pyrometers and the like, for measuring temperature of the wafers in the chambers 6 and 7, respectively.

The chamber 6, the chamber 7, the partition 13, and a support members 14 and 15 on which wafers are disposed are made, for example, of quartz. When anneal processing is performed after disposing a wafer on the support member 14 in the chamber 6, nitrogen gas is introduced into the chamber 6 and the wafer is heated by the lamp 8 to the temperature of approximately 400 through 1100 degrees Celsius, preferably, for example, 1000 degree Celsius. After the anneal processing is performed and the wafer is removed, other wafers (product wafers) each are sequentially loaded into the chamber 6 by using single wafer processing and anneal processing is sequentially performed.

After performing the anneal processing of a predetermined number of product wafers or after a predetermined processing time has elapsed, a dummy wafer 11 is loaded into the chamber 6 in place of a product wafer, and at the same time a dummy wafer 12 is loaded into the attached chamber 7. The dummy wafers 11 and 12 are, for example, silicon bare wafers on which thin films and the like are not formed and from which substantially no out-diffusion occurs. Then the dummy wafers 11 and 12 in both chambers 6 and 7 are heated simultaneously by the lamp 8. Thereafter, by the pyrometers 9 and 10, the temperature of each of the dummy wafers 11 and 12 in both chambers 6 and 7 is measured, and a temperature difference between the measured temperatures of the dummy wafers 11 and 12 is obtained or calculated. By using the temperature difference between the measured temperatures, the pyrometer 9 is calibrated and anneal temperature is compensated. The dummy wafer 12 is loaded into the attached chamber 7 every time the pyrometer 9 is calibrated.

When the compensation of the anneal temperature is to be performed, a dummy wafer 12 of silicon on which thin film and the like is not formed is introduced into the attached chamber 7 and disposed on the support member 15, and, at the same time, similar dummy wafer 11 is loaded into the chamber 6 and placed on the support member 14. Since the dummy wafer 12 is not a product wafer, thin film and the like is not formed thereon, and out-diffusion or outgassing of materials forming the thin film and the like from the wafer does not occur. Therefore, the chamber 7 which is not loaded with product wafers but loaded only with dummy wafers is not contaminated by the out-diffusion from the product wafers, unlike the chamber 6. Then, the temperature of the dummy wafer 12 in the attached chamber 7 is measured by the pyrometer 10, and the temperature of the dummy wafer 11 in the chamber 6 is measured by the pyrometer 9.

The wafer 11 and the wafer 12 are both heated simultaneously by the lamp 8 and actual temperature of the wafer 11 and the actual temperature of the wafer 12 are substantially the same. This is because, the wafers, including the product wafers, are usually disposed near the lower wall of the chambers, and ambient gas such as nitrogen gas and the like flows mainly through a space between the upper surface of the wafers and the inner surface of the upper wall of the chamber during the heat treatment. Therefore, contamination of the upper wall of the chamber is much smaller than that of the lower wall of the chamber. The temperature difference between the measured temperatures of the dummy wafers 12 and 11 measured by the pyrometers 10 and 9, respectively, is caused by the contamination of inner wall of the chamber 6. By calibrating the pyrometer 9 which measures the temperature of the wafer in the chamber 6 for processing product wafers such that the temperature of the dummy wafer 11 measured by the pyrometer 9 coincides with the temperature of the dummy wafer 12 measured by the pyrometer 10, influence of the contamination of the chamber 6 on the measured temperature of product wafers can be removed and reproducibility of the processing temperature of the product wafers can be improved.

In the lamp annealer according to the present embodiment, compensation or calibration processing of anneal temperature is performed periodically, for example, every predetermined term such as every one month, or every predetermined number of processed wafers such as every 1000 wafers.

Figure 2:
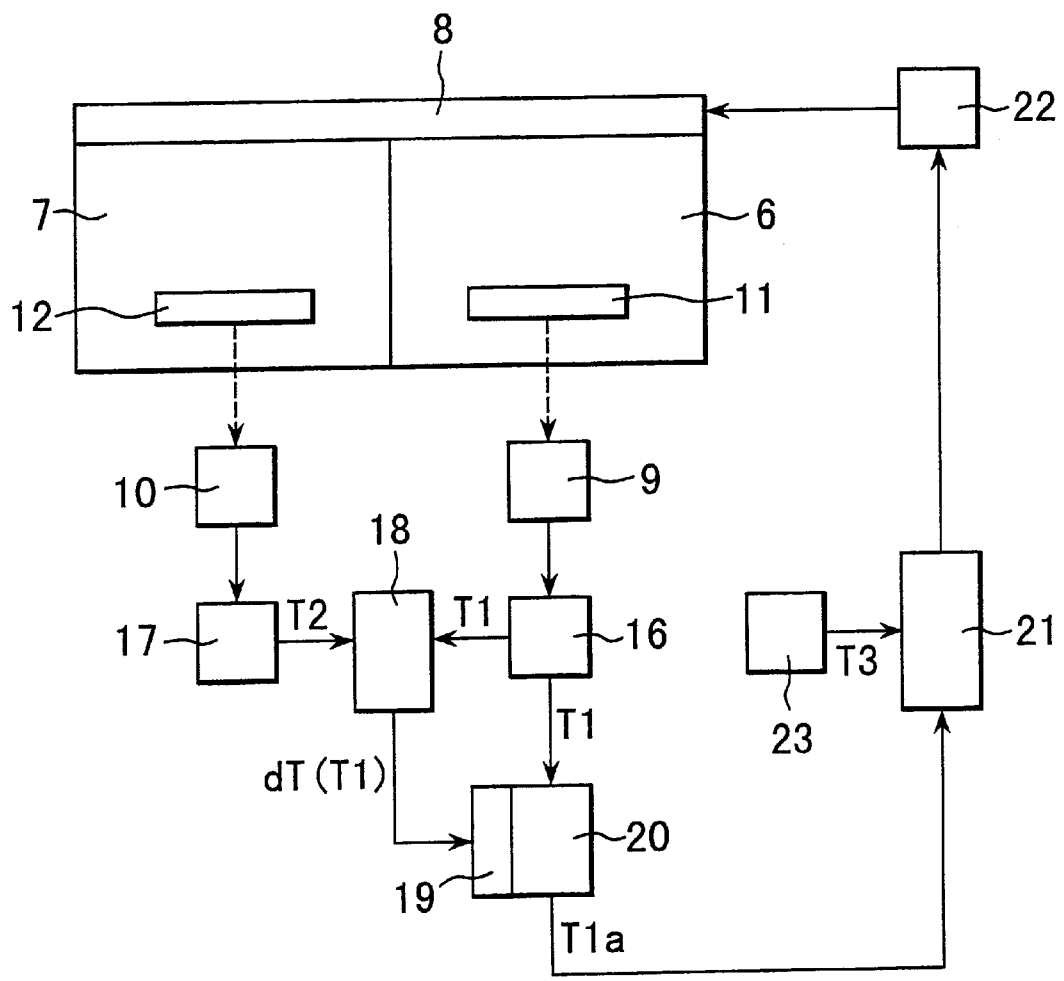
FIG. 2 is a schematic block diagram showing a constitution relating to a process of calibrating a pyrometer by using dummy wafers in the lamp annealer of FIG. 1.

FIG. 2 is a schematic block diagram showing a constitution including circuit portions relating to a calibration processing of pyrometer or compensation processing of anneal temperature in the lamp annealer of FIG. 1. It should be noted that the constitution of FIG. 2 can be realized by any means, for example, hardware circuits, computer including software, and the like. As shown in FIG. 2, when the compensation processing of anneal temperature is performed, the dummy wafer 11 is loaded into the chamber 6 for processing product wafers, and in this time the dummy wafer 12 is also loaded into the attached chamber 7. In this condition, the dummy wafers 11 and 12 are both simultaneously heated by the lamp 8.

The pyrometer 9 measures the temperature of the dummy wafer 11, and a numerical section 16 composed, for example, by an analog-digital (A/D) converter generates numerical value of the measured temperature T1. At the same time, the pyrometer 10 measures the temperature of the dummy wafer 12, and a numerical section 17 composed, for example, by an analog-digital (A/D) converter generates numerical value of the measured temperature T2. It should be noted that the numerical sections 16 and 17 may be included in the pyrometers 9 and 10, respectively.

In this occasion, inner wall of the chamber 6 is contaminated by the out-diffusion occurred on the anneal processing of the product wafers, and, on the other hand, the inner wall of the chamber 7 is not contaminated, because, in the chamber 7, anneal processing of product wafers is not performed and only a silicon dummy wafer is introduced. Although both the dummy wafer 11 and the dummy wafer 12 are actually heated to substantially the same temperature by the same heat source, i.e., the same lamp 8, the difference on the contamination of the chamber 6 and the chamber 7 causes the difference of the measured temperature T1 of the dummy wafer 11 by the pyrometer 9 and the measured temperature T2 of the wafer 12 by the pyrometer 10.

The measured temperatures T1 and T2 represented by numerical values generated by the numerical sections 17 and 18 are inputted to a differential section 18. The differential section 18 generates a difference value dT=T1−T2 between the measured temperature T1 and the measured temperature T2. The difference value dT is inputted to and stored in a storage section 19, composed, for example, by a semiconductor memory device and the like, as a compensation value dT(T1) in the measured temperature T1 when a measured temperature of a wafer in the chamber 6 measured by the pyrometer 9 is T1. It should be noted that the compensation value dT(T1) stored in the storage section 19 may be a value obtained by sampling the above-mentioned difference value dT several times for a predetermined time period to obtain several values and by averaging the several values.

On the other hand, the data value of the measured temperature T1 generated in the numerical section 16 is also inputted to a compensation section 20. In the compensation section 20, compensation processing is performed in which the compensation value dT(T1) stored in the storage section 19 is added to the measured temperature T1, and compensated temperature T1a of the dummy wafer 11 is outputted from the compensation section 20 and applied to a control section 21, where T1a=T1+dT(T1)=T2. The control section 21 also receives a data of target temperature T3 inputted thereto from a data input section 23 such as a digital data input equipment, a microcomputer and the like. The control section 21 compares the compensated temperature T1a and the target temperature T3, and generates an error data between the compensated temperature T1a and the target temperature T3 which is applied to a voltage controlled voltage source 22 to adjust an output voltage applied to the lamp and to adjust light intensity of the lamp or luminance such that the compensated temperature T1a becomes a predetermined target control temperature T3.

Figure 3:
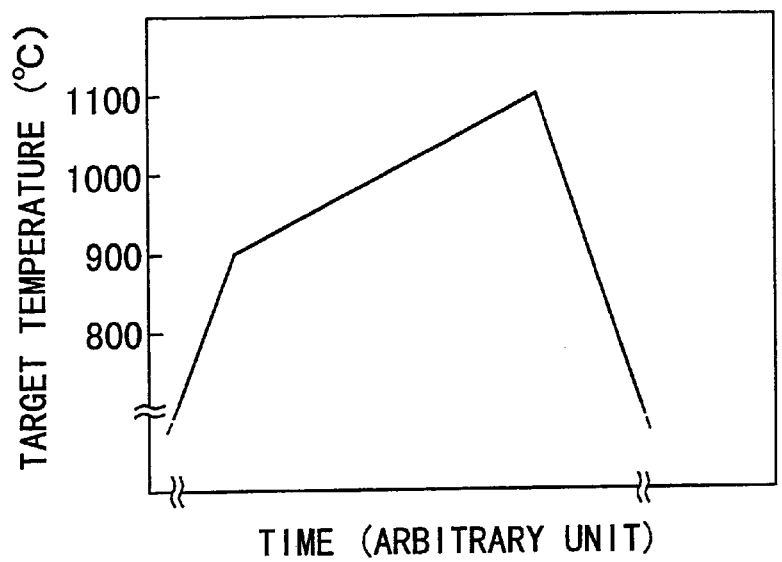
FIG. 3 is a graph showing an example of temperature setting curve for target temperatures when a compensation value is obtained in each temperature over a predetermined temperature range.

It is possible to obtain the compensation values dT(T1) in various temperatures over a wide temperature range and store the compensation values dT(T1) in the storage section 19. To this end, it is possible to vary the target temperature T3 stepwise or continuously and to sequentially store the compensation values dT(T1) in the storage section 19. FIG. 3 is a graph illustrating an example of conceptual temperature variation pattern of the target temperature T3 of a dummy wafer in a calibration processing of an annealer, wherein ordinate designates a target temperature T3 of a dummy wafer, and abscissa designates time. Since the compensation values in a temperature range including temperatures often used as actual anneal temperatures of product wafers, for example, 1000 degree Celsius and the like, are especially important, varying rate of temperature in the above-mentioned temperature range may be decreased as shown in FIG. 3. In FIG. 3, varying rate is decreased in a temperature range from 900 degree Celsius to 1100 degree Celsius, for example.

Figure 4:
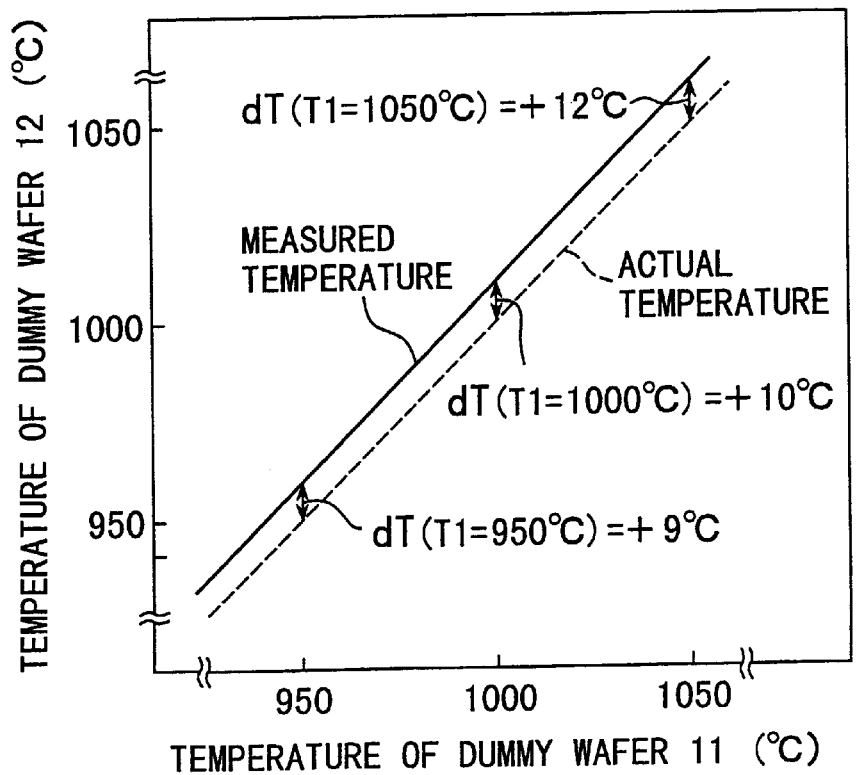
FIG. 4 is a graph showing an example of a relation between temperatures of two dummy wafers when temperature thereof is varied in accordance with the graph of FIG. 3.

FIG. 4 is a exemplary graph showing a relation between the temperatures of the dummy wafer 11 and the temperatures of the dummy wafer 12 when the temperatures of the dummy wafers are varied in accordance with the temperature control pattern of FIG. 3. In FIG. 4, ordinate designates temperature relating to the dummy wafer 12, and abscissa designates temperature relating to the dummy wafer 11. In FIG. 4, a solid line designates a relation between the measured temperature T2 outputted from the numerical section 17 and the measured temperature T1 outputted from the numerical section 16. A dotted line in FIG. 4 designates a relation between the actual temperatures of the dummy wafers 11 and 12. It should be noted that the actual temperatures of the dummy wafers 11 and 12 whose relation is represented by the dotted line should be equal to each other. The temperature difference of the dotted line and the solid line at each temperature of the dummy wafer 11 is an error of the measured temperature of a wafer in the chamber 6 caused by the contamination of the inner wall of the chamber 6, and is stored in the storage section 19 as a compensation value dT(T1) at each of various temperatures. In the example of FIG. 4, when the measured temperatures of the wafer 11 in the chamber 6 are, for example, 950, 1000 and 1050 degrees Celsius, the compensation values at these temperatures are +9, +10 and +12 degrees Celsius, respectively. By using such compensation values, it is possible to compensate the measured temperature of any wafer loaded into the chamber 6 over a wide temperature range. Therefore, by using one lamp annealer, a variety of product wafers can be precisely heat treated at a variety of anneal temperatures.

Figure 5:
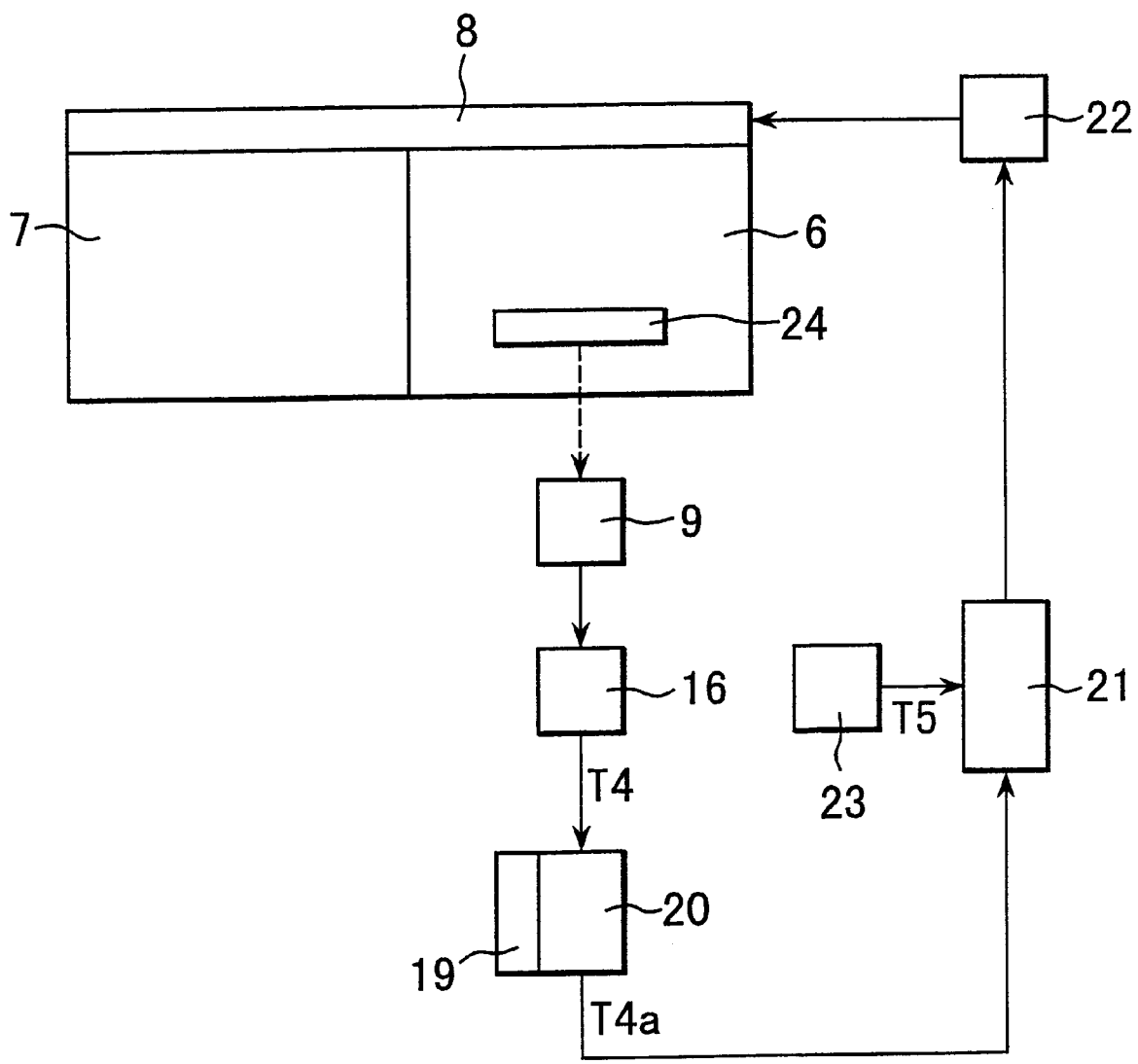
FIG. 5 is a schematic block diagram showing a constitution relating to the control of anneal processing temperatures of product wafers in the annealer of FIG. 1 after performing the process of calibrating a pyrometer in the constitution of FIG. 2.
Figure 6:
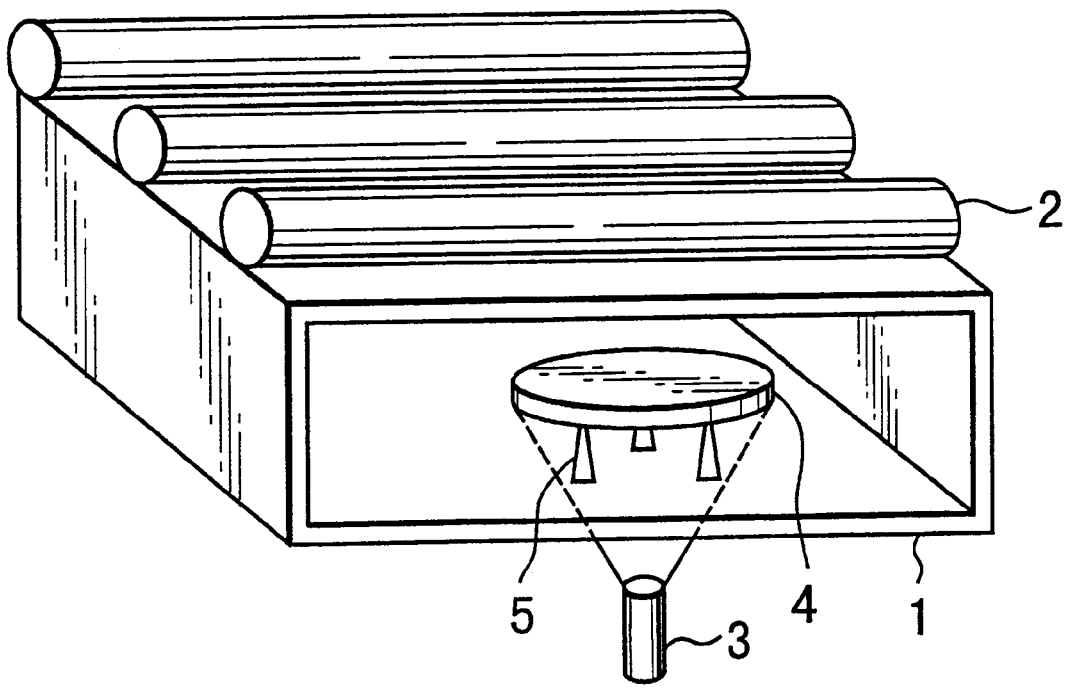
FIG. 6 is a schematic perspective view illustrating a conventional lamp annealer.

FIG. 5 is a schematic block diagram illustrating a constitution including circuit portions relating to temperature control operation, in the annealing process of a product wafer in the lamp annealer of FIG. 1, the annealing process being performed after the calibration processing of the annealer was done as described with reference to FIG. 2.

In the annealing process, a product wafer 24 is loaded into the chamber 6. In this case, no wafer is loaded into the attached chamber 7. The product wafer 24 is heated by the lamp 8 and annealed. The pyrometer 9 measures the temperature of the product wafer 24, and the numerical section 16 generates a numerical data of the measured temperature T4. The numerical data of the measured temperature T4 is supplied to the compensation section 20. In the compensation section 20, the compensation value dT(T4) corresponding to the measured temperature T4 is added to the measured temperature T4 inputted from the numerical section 16. The compensation value dT(T4) is obtained from the compensation values stored in the storage section 19, or calculated for example by interpolation, from the compensation values of temperatures near the temperature T4. The compensation section 20 outputs the compensated measured temperature T4a of the product wafer 24 which is inputted to the control section 21, where T4a=T4+dT(T4).

The control section 21 also receives a data of a predetermined target temperature T5 inputted thereto from the data input section 23. The control section 21 compares the compensated temperature T4a and the target temperature T5 and generates an error data between the T4a and the T5 which is applied to the voltage controlled power source 22 to adjust the intensity of the light from the lamp 8 such that the compensated measured temperature T4a of the product wafer 24 becomes the target temperature T5 . In this way, the error of the measured temperature of a product wafer 24 caused by the contamination of the chamber 6 is compensated and by using the compensated measured temperature, the anneal temperature of the product wafer 24 is correctly adjusted. Therefore, the product wafer 24 is annealed precisely at a predetermined target temperature T5.

As the annealing process is continued for a number of product wafers, the contamination of the lower inner wall of the chamber 6 gradually increases due to the out-diffusion from the product wafers, and the difference between the temperature of the product wafer measured by the pyrometer 9 and the actual temperature of the product wafer further changes. To this end, the calibration process of the pyrometer using the dummy wafers as shown in FIG. 2 is performed periodically, for example, every predetermined number of wafers anneal processed or every predetermined process time period, thereby updating the compensation values dT(T1) stored in the storage section 19. Thereafter, by using the updated compensation values, the anneal temperature of the product wafers is adjusted as described with reference to FIG. 5. In this way, deviation of the anneal temperature due to the contamination of the chamber caused by the out-diffusion from the product wafer can always be avoided.

In another embodiment, an indicator such as a numerical display device is provided for indicating each of output temperatures of the numerical sections 16 and 17. The indicator is used to manually control the anneal temperature, when, for example, the product wafer is always annealed at the same temperature T5. In this case, when the measured temperature of the dummy wafer 12 outputted by the numerical section 17 becomes T5, a measured temperature T6 of the dummy wafer 11 outputted by the numerical section 16 is read manually. Thereafter, when the temperature adjustment in the anneal processing of product wafers is performed, the target value of the anneal temperature is adjusted not to T5 but to T6, thereby the control section 21 controls the output voltage from the voltage controlled power source 22 to the lamp 8 so that the measured temperature T4 of the product wafer 24 outputted by the numerical section 16 becomes T6. In this case, the product wafer can be annealed correctly at the predetermined anneal temperature (T5), without using the differentiation section 18, the storage portion 19 and the compensating portion 20 mentioned above. Also, it is possible to make the output voltage of the power source 22 manually adjustable, and to adjust the output voltage thereof manually so that the measured temperature of the product wafer 23 measured by the pyrometer 9 and outputted by the numerical section 16 becomes T6. In this case, the control section 21 and the data input section 23 can also be omitted.

According to the present invention, reproducibility of the temperature of anneal processing of product wafers can be improved, and characteristics and parameters of the product wafers can be precisely controlled and stabilized. This is because, the temperature for anneal processing the product wafers is periodically compensated such that the anneal processing temperature becomes the same as the temperature measured in the chamber in which influence of the out-diffusion from the product wafer does not occur. Therefore, it is possible to always perform the annealing process at the temperature which is the same as the temperature of the condition the chamber is not contaminated. Thus, it is possible perform stable and reproducible anneal processing without being affected by the contamination of the chamber.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are intended to be included within the scope of the present invention. Therefore, it is intended that this invention encompasses all of the variations and modifications as fall within the scope of the appended claims.

What is claimed is:

1. A lamp annealer for performing heat treatment of product wafers, comprising:
    a first chamber for loading a product wafer to be heat treated or a dummy wafer;
    a second chamber disposed adjacent said first chamber, for loading only a dummy wafer;
    a pyrometer means for measuring a temperature of a wafer within said first chamber and a temperature of a wafer within said second chamber; and
    a lamp means for heating a wafer within said first chamber and a wafer within said second chamber.

2. The lamp annealer as set forth in claim 1, wherein said pyrometer means comprises a first pyrometer for measuring a temperature of a wafer within said first chamber and a second pyrometer for measuring a temperature of a wafer within said second chamber.

3. The lamp annealer as set forth in claim 1, wherein said lamp means can simultaneously heat both a wafer within said first chamber and a wafer within said second chamber.

4. The lamp annealer as set forth in claim 1, wherein said dummy wafer is a silicon wafer from which substantially no out-diffusion occurs.

5. The lamp annealer as set forth in claim 1, wherein, periodically, a dummy wafer is loaded into said first chamber in place of said product wafer and at the same time a dummy wafer is loaded into said second chamber, wherein both dummy wafers are heated by said lamp means at the same time, and wherein a temperature of said dummy wafer in said first chamber and a temperature of said dummy wafer in said second chamber are measured by said pyrometer means.

6. The lamp annealer as set forth in claim 5, wherein a difference between the temperature of said dummy wafer within said first chamber and the temperature of said dummy wafer within said second chamber both measured by said pyrometer means is detected, and wherein, when a product wafer within said first chamber is heat treated by said lamp means, the intensity of light generated by said lamp means is compensated based on said difference.

7. A lamp annealer for performing heat treatment of product wafers, comprising:
    a first chamber for loading a product wafer to be heat treated or a dummy wafer;
    a second chamber disposed adjacent said first chamber, for loading only a dummy wafer;
    a first pyrometer for measuring a temperature of said product wafer or said dummy wafer loaded into said first chamber;
    a second pyrometer for measuring a temperature of said dummy wafer loaded into said second chamber; and
    a lamp means for heating and annealing said product wafer loaded into said first chamber, wherein, when a dummy wafer is loaded into said first chamber and another dummy wafer is loaded into said second chamber, said lamp means can simultaneously heat both said dummy wafer within said first chamber and said another dummy wafer within said second chamber.

8. The lamp annealer as set forth in claim 7, further comprising:
    a comparing means for detecting a temperature difference between a temperature of a dummy wafer within said first chamber measured by said first pyrometer and a temperature of a dummy wafer within said second chamber measured by said second pyrometer, after a dummy wafer is loaded into said first chamber and a dummy wafer is loaded into said second chamber and said dummy wafer within said first chamber and said dummy wafer within said second chamber are both simultaneously heated by said lamp means;
    a storage means for storing said temperature difference detected by said comparing means;
    a compensating means, in response to said temperature difference stored in said storage means, for compensating a temperature of said product wafer in said first chamber measured by said first pyrometer when said product wafer is within said first chamber; and
    a control means for adjusting intensity of light of said lamp means heating said product wafer in said first chamber such that the temperature of said product wafer in said first chamber measured by said first pyrometer and compensated by said compensating means becomes a predetermined target anneal temperature.

9. The lamp annealer as set forth in claim 1, wherein said lamp annealer is a single wafer processing annealer.

10. The lamp annealer as set forth in claim 1, wherein said pyrometer means comprises radiation pyrometers.

11. The lamp annealer as set forth in claim 1, wherein said pyrometer means comprises photoelectric pyrometers.

12. A method for annealing a semiconductor wafer, comprising the steps of:

loading a first dummy wafer into a first chamber, and loading a second dummy wafer into a second chamber disposed adjacent to said first chamber;

heating said first dummy wafer in said first chamber and said second dummy wafer in said second chamber simultaneously by a lamp means;

measuring by a pyrometer means temperatures of said first dummy wafer in said first chamber and said second dummy wafer in said second chamber heated by said lamp means;

detecting a temperature difference between the temperatures of said first dummy wafer in said first chamber and said second dummy wafer in said second chamber measured by said pyrometer means;

loading a product wafer into said first chamber in place of said dummy wafer; and performing heat treatment of said product wafer by using said lamp means wherein intensity of light emitted from said lamp means is compensated based on said temperature difference.

13. The method for annealing a semiconductor wafer as set forth in claim 12, wherein said first and second dummy wafers are silicon wafers from which substantially no out-diffusion occurs.

14. A method for annealing a semiconductor wafer, comprising the steps of:

loading a first dummy wafer into a first chamber, and loading a second dummy wafer into a second chamber disposed adjacent to said first chamber;

heating said first dummy wafer in said first chamber and said second dummy wafer in said second chamber simultaneously by a lamp means;

measuring by a first pyrometer means a temperature of said first dummy wafer in said first chamber and measuring by a second pyrometer a temperature of said second dummy wafer in said second chamber, said first dummy wafer in said first chamber and said second dummy wafer being simultaneously heated by said lamp means;

comparing the temperature of said first dummy wafer in said first chamber measured by said first pyrometer and the temperature of said second dummy wafer in said second chamber measured by said second pyrometer;

calibrating said first pyrometer so that the temperature of said first dummy wafer in said first chamber measured by said first pyrometer becomes substantially equal to the temperature of said second dummy wafer in said second chamber measured by said second pyrometer;

loading a product wafer into said first chamber in place of said dummy wafer; and heating to anneal said product wafer by using said lamp means, wherein intensity of light emitted from said lamp means is controlled so that the temperature of said product wafer measured by said first pyrometer calibrated in said step of calibrating said first pyrometer becomes a predetermined target anneal temperature.

15. The method for annealing a semiconductor wafer as set forth in claim 14, wherein said first and second dummy wafers are silicon wafers from which substantially no out-diffusion occurs.

* * * * *